US009019701B2

(12) United States Patent  
Ning et al.

(10) Patent No.: US 9,019,701 B2  
(45) Date of Patent: Apr. 28, 2015

(54) RACK SERVER SYSTEM

(71) Applicants: Inventec (Pudong) Technology Corporation, Shanghai (CN); Inventec Corporation, Shanghai (CN)

(72) Inventors: Qi-Guang Ning, Shanghai (CN); Ji-Peng Xu, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 292 days.

(21) Appl. No.: 13/776,085

(22) Filed: Feb. 25, 2013

(65) Prior Publication Data

US 2014/0085811 A1  Mar. 27, 2014

(30) Foreign Application Priority Data

Sep. 21, 2012  (CN) .............................. 2012 0 355037

(51) Int. Cl.
| | |
|---|---|
| G06F 1/18 | (2006.01) |
| H05K 7/14 | (2006.01) |
| H05K 7/20 | (2006.01) |
| G06F 1/20 | (2006.01) |

(52) U.S. Cl.  
CPC .............. G06F 1/189 (2013.01); H05K 7/1492 (2013.01)

(58) Field of Classification Search  
CPC .............. G06F 1/16; G06F 1/18; G06F 1/20; H05K 5/20; H05K 7/14; H05K 7/16; H05K 7/18; H05K 7/20; H01R 12/16; H01R 25/00; A47B 81/00; A47F 7/00

USPC .............. 361/679.46–679.51, 690–695, 715, 361/719, 722–727, 728, 729, 788, 790, 361/679.02; 439/110, 212, 246, 374, 638; 165/80.2, 80.3, 104.33, 121–126, 185; 454/184

See application file for complete search history.

(56) References Cited

U.S. PATENT DOCUMENTS

| | | | | |
|---|---|---|---|---|
| 4,361,372 | A | * | 11/1982 | Majkrzak et al. .............. 439/247 |
| 6,157,534 | A | * | 12/2000 | Gallagher et al. ............. 361/724 |
| 6,621,712 | B2 | * | 9/2003 | Siira et al. ...................... 361/796 |
| 6,927,974 | B2 | * | 8/2005 | Robillard et al. ........... 361/679.4 |
| 7,289,334 | B2 | * | 10/2007 | Behrens et al. ................ 361/788 |

(Continued)

FOREIGN PATENT DOCUMENTS

JP  02007140580 A  *  6/2007  .............. G06F 13/14

Primary Examiner — Michail V Datskovskiy  
(74) Attorney, Agent, or Firm — Huffman Law Group, PC

(57) ABSTRACT

A rack server system includes a container, an electrically conductive component, a power supply, a signal connecting base, a server, and an RMC. The electrically conductive component and the signal connecting base are fixed in the container. The power supply is electrically connected to the electrically conductive component for supplying a direct current power. The signal connecting base includes multiple connectors. The server, disposed in the container removably, includes a power input port and a connecting element. The power input port is electrically connected to the electrically conductive component removably. The connecting element is connected to the connector removably. When the connecting element is electrically connected to the connector, the RMC communicates with the server via the connecting element and the one of the connectors and determines the position of the server in the container according to another position of the connector which is electrically connected to the server.

12 Claims, 11 Drawing Sheets

(56) References Cited

U.S. PATENT DOCUMENTS

| | | | |
|---|---|---|---|
| 7,791,890 B2 * | 9/2010 | Ishida | 361/727 |
| 8,077,455 B2 * | 12/2011 | Jian | 361/679.48 |
| 8,616,902 B2 * | 12/2013 | Li et al. | 439/110 |
| 8,917,493 B2 * | 12/2014 | Wang | 361/601 |

\* cited by examiner

RACK SERVER SYSTEM

CROSS-REFERENCE TO RELATED APPLICATIONS

This non-provisional application claims priority under 35 U.S.C. §119(a) on Patent Application No(s). 201210355037.7 filed in China on Sep. 21, 2012, the entire contents of which are hereby incorporated by reference.

BACKGROUND OF THE INVENTION

1. Technical Field of the Invention

The disclosure relates to a server system, and more particularly to a rack server system.

2. Description of the Related Art

So far, the world is in a highly-developing information technology era, and therefore, each enterprise or human being uses a personal computer (such as a desktop or a laptop) to perform daily tasks. Moreover, with the maturity of telecommunication technology, the conventional regional commerce model has already been replaced by transnational electronic business (e-business) such that e-business has become a trend. However, conventional personal computers may not satisfy enterprise requirements for e-business. Thus, computer manufacturers have developed servers with certain functions (such as a cloud server, a firewall server, etc.) in order to solve the problem of e-business for enterprises.

Consider, for example, a rack server system including a cabinet and multiple servers which are disposed in the cabinet. In other words, the rack server system comprises multiple servers which are disposed simultaneously in the same cabinet. Such a rack server system not only saves more space and is easily managed, but also executes a large number of operations. Thus, this rack server system is generally adopted by enterprises. However, when each server is assembled in the cabinet, a technician needs to connect each server to the cabinet by wiring in order to electrically connect each server to the cabinet. Therefore, it is time consuming and inconvenient for the technician to assemble the rack server system.

SUMMARY OF THE INVENTION

This disclosure provides a rack server system comprising a container, an electrically conductive component, a power supply, a signal connecting base, a server, and a rack management controller (RMC). The electrically conductive component is fixed in the container. The power supply is disposed in the container. The power supply is electrically connected to the electrically conductive component for supplying a direct current power. The signal connecting base is fixed in the container. The signal connecting base includes multiple connectors. The server is disposed in the container in a removable way. The server comprises a power input port and a connecting element. The power input port is electrically connected to the electrically conductive component in a removable way. The connecting element is connected to one of the connectors in a removable way. With the server removed from the container, the power input port and the connecting element are separated from the electrically conductive component and the one of the connectors, respectively. With the server installed into the container, the power input port and the connecting element joint with the electrically conductive component and the one of the connectors, respectively. The RMC, disposed in the container, is electrically connected to the signal connecting base. When the connecting element of the server is electrically connected to the one of the connectors, the RMC communicates with the server via the one of the connectors and the connecting element of the server, and determines the position of the server in the container according to the position of the one of the connector which is electrically connected to the server.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

The detailed features and advantages of the disclosure are described below in great detail through the following embodiments, thus the content of the detailed description is sufficient for those skilled in the art to understand the technical content of the present disclosure and to implement the disclosure accordingly. Based upon the content of the specification, the claims, and the drawings, those skilled in the art can easily understand the relevant objectives and advantages of the disclosure.

Figure 1:
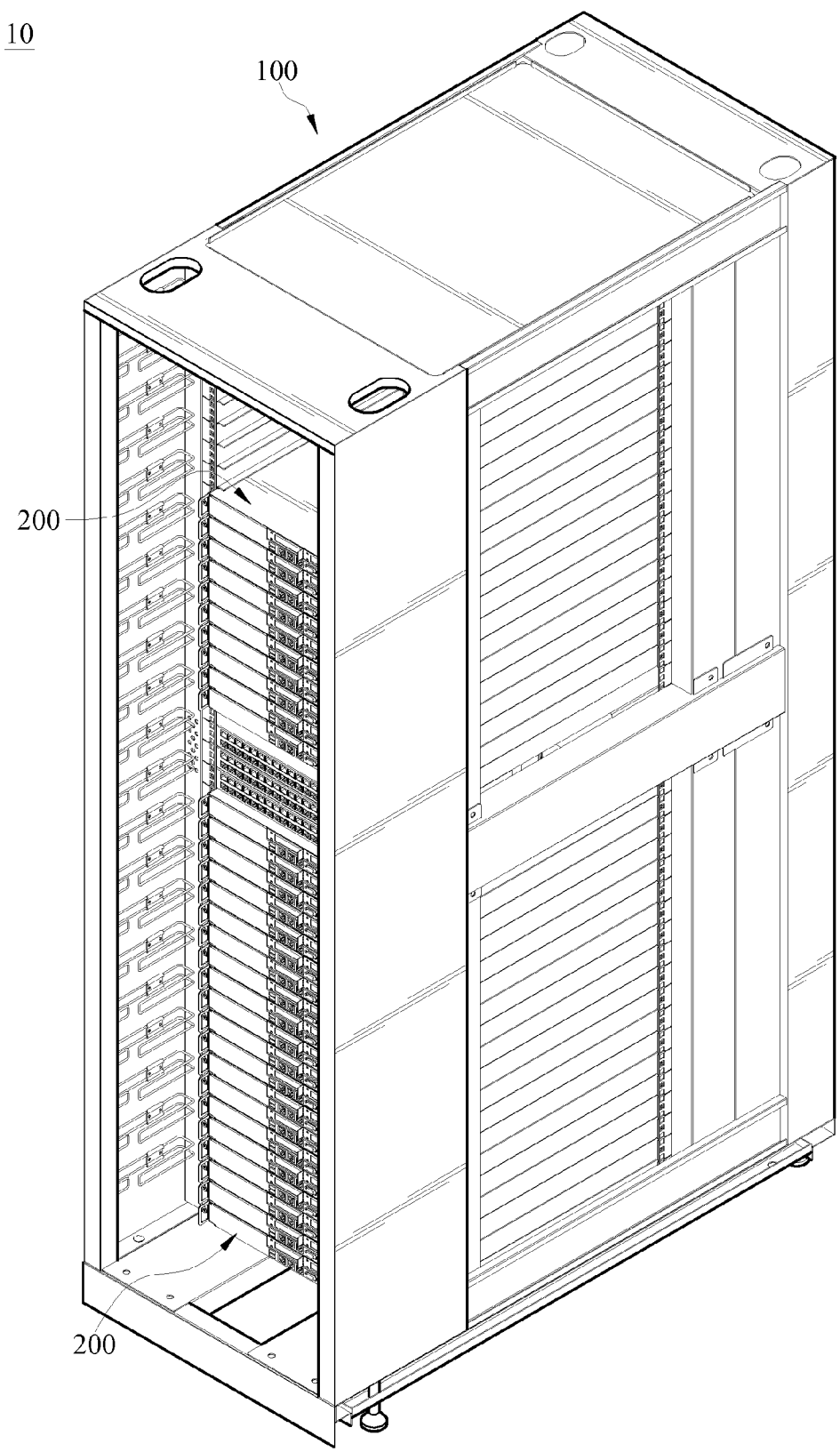
FIG. 1 illustrates a perspective view of a rack server system according to the first embodiment of the disclosure.
Figure 2:
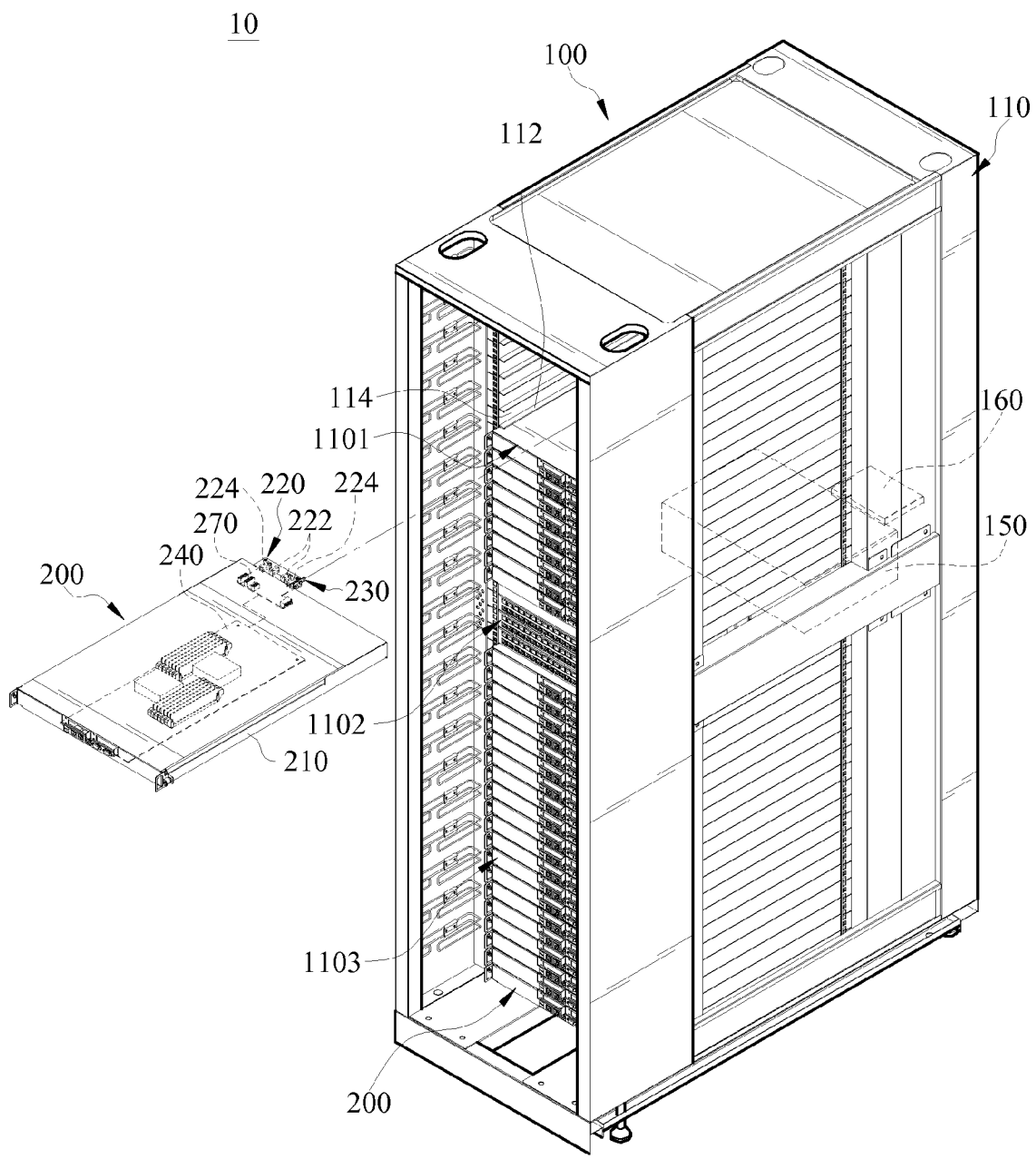
FIG. 2 illustrates an exploded view of the rack server system in FIG. 1.
Figure 3:
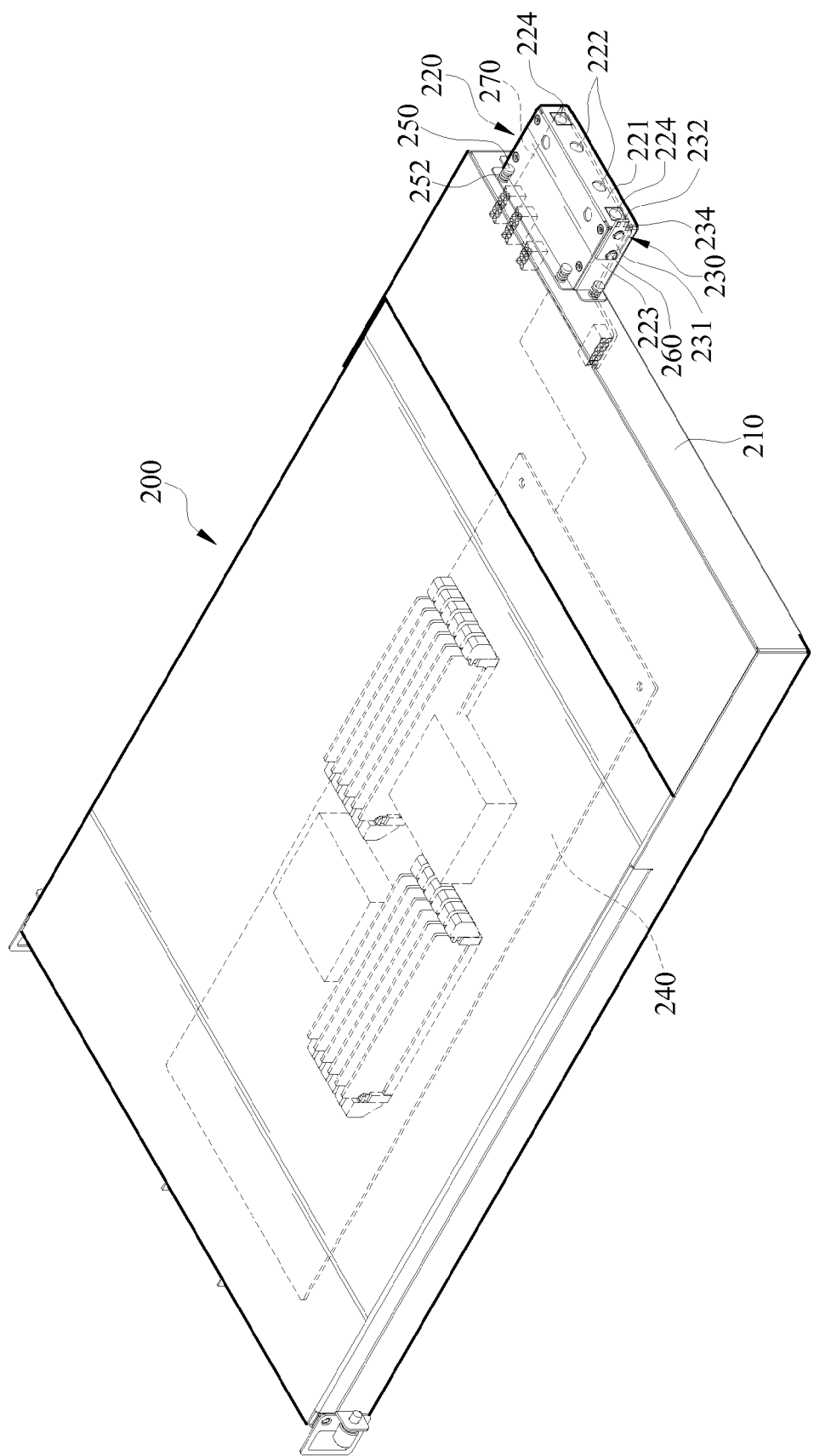
FIG. 3 illustrates a perspective view of a server in FIG. 2.

Please refer to FIGS. 1 to 3, FIG. 1 illustrates a perspective view of a rack server system according to an embodiment of the disclosure, FIG. 2 illustrates an exploded view of the rack server system in FIG. 1, and FIG. 3 illustrates a perspective view of a server in FIG. 2.

A rack server system 10 in this embodiment takes a cabinet type rack server system for an example. The rack server system 10 comprises a server cabinet 100 and at least one server 200. The at least one server 200 is disposed in the server cabinet 100 in a removable way.

Furthermore, the server 200 comprises a shell 210, a mother board 240, a power input port 220 and a connecting element 230.

The mother board 240 is disposed in the shell 210.

The power input port 220 is disposed on the shell 210. The power input port 220, electrically connected the mother board 240, protrudes from one side of the shell 210. Furthermore, the server 200 comprises multiple first fixing elements 250 which pierce the power input port 220 and the shell 210 such that the power input port 220 is affixed to the side of the shell 210. However, the number of the first fixing elements 250 is not limited to those shown in the figures, and the person skilled in the art may adjust the number of the first fixing elements 250 according to actual requirements. Moreover, the power input port 220 includes a surface 221 which is disposed on an end of the power input port 220 away from the shell 210. Two power sockets 222 and two positioning holes 224 all are disposed on the surface 221 and are arranged abreast and separately, and the two power sockets 222 are positioned between the two positioning holes 224. The two power sockets 222 and the two positioning holes 224 extend from the surface 221. The two power sockets 222 are electrically connected to the mother board 240 and used for receiving an outer power source such that power from the power source may be supplied to the mother board 240. The two positioning hole 224 provides positioning for the server 200 when the server 200 is disposed in the server cabinet 100.

However, in this embodiment, the number of the positioning holes 224 (i.e., two) is presented for exemplary purposes and is not limited by the examples discussed herein. For example, in other embodiments, the number of the positioning hole(s) 224 may be one or more than two.

The connecting element 230 is in the vicinity of the power input port 220 and is electrically connected to the mother board 240. Furthermore, the connecting element 230 comprises a main body 231 and a protruding part 232 which is disposed on an end of the main body 231. The protruding part 232 has an electrically conductive layer 234. The server 200 further comprises multiple second fixing elements 260 which pierce the main body 231 of the connecting element 230 and the power input port 220 such that the connecting element 230 is fixed on a lateral surface 223 of the power input port 220. Moreover, the lateral surface 223 is in the vicinity of and is substantially perpendicular to the surface 221 of the power input port 220. When the connecting element 230 is fixed on the lateral surface 223 of the power input port 220, the protruding part 232 of the connecting element 230 protrudes from the surface 221 of the power input port 220. However, the number of the second fixing elements 260 is not limited by this disclosure and the person skilled in the art may adjust the number of the second fixing elements 260 according to actual requirements.

Moreover, in some embodiments, an adapter board 270 may further be disposed in the power input port 220 and be electrically connected to the mother board 240 and the connecting element 230 such that the connecting element 230 is electrically connected to the mother board 240 via the adapter board 270.

Figure 4A:
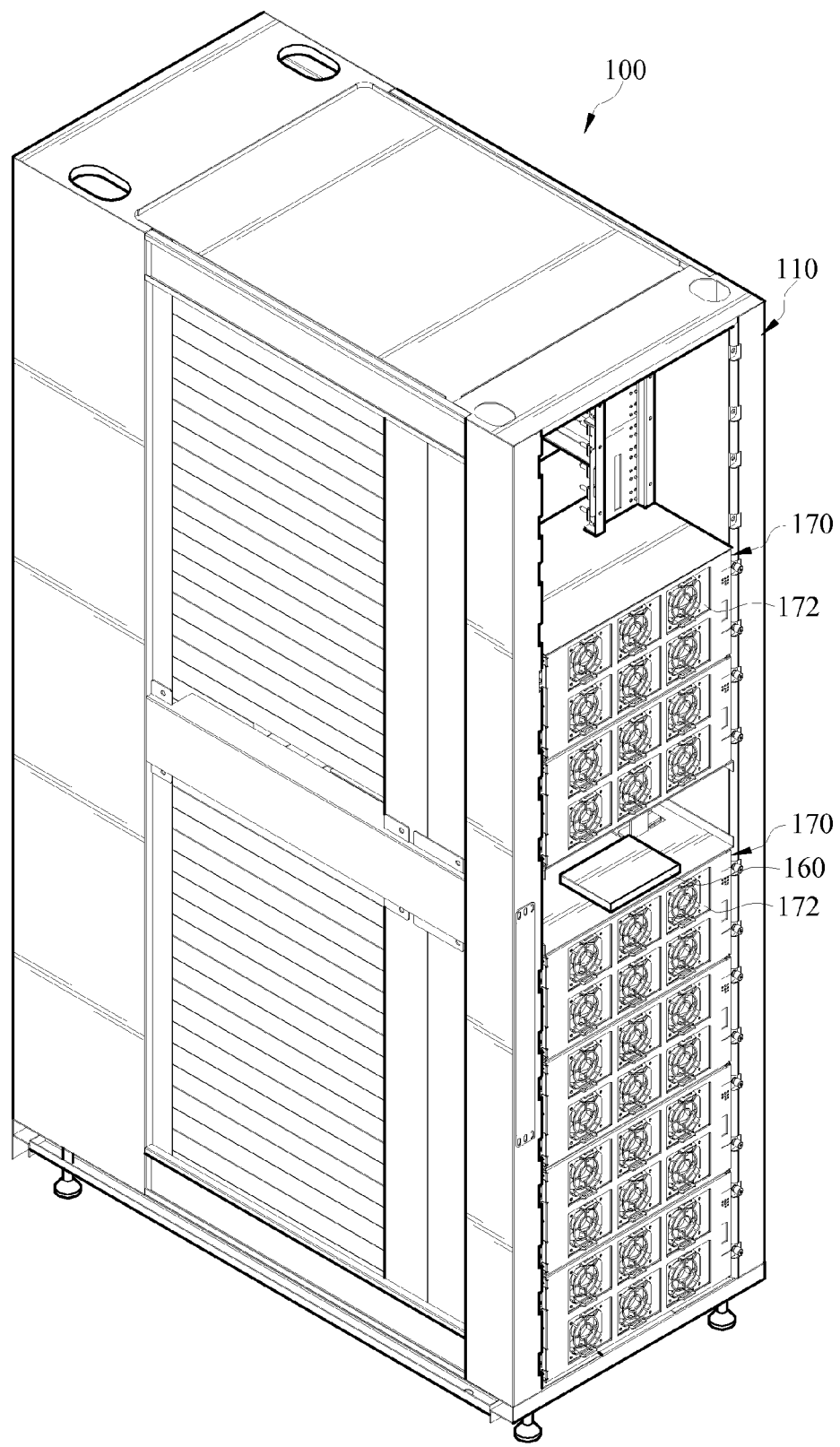
FIG. 4A illustrates a perspective view with another viewing angle of a server cabinet in FIG. 2.
Figure 4B:
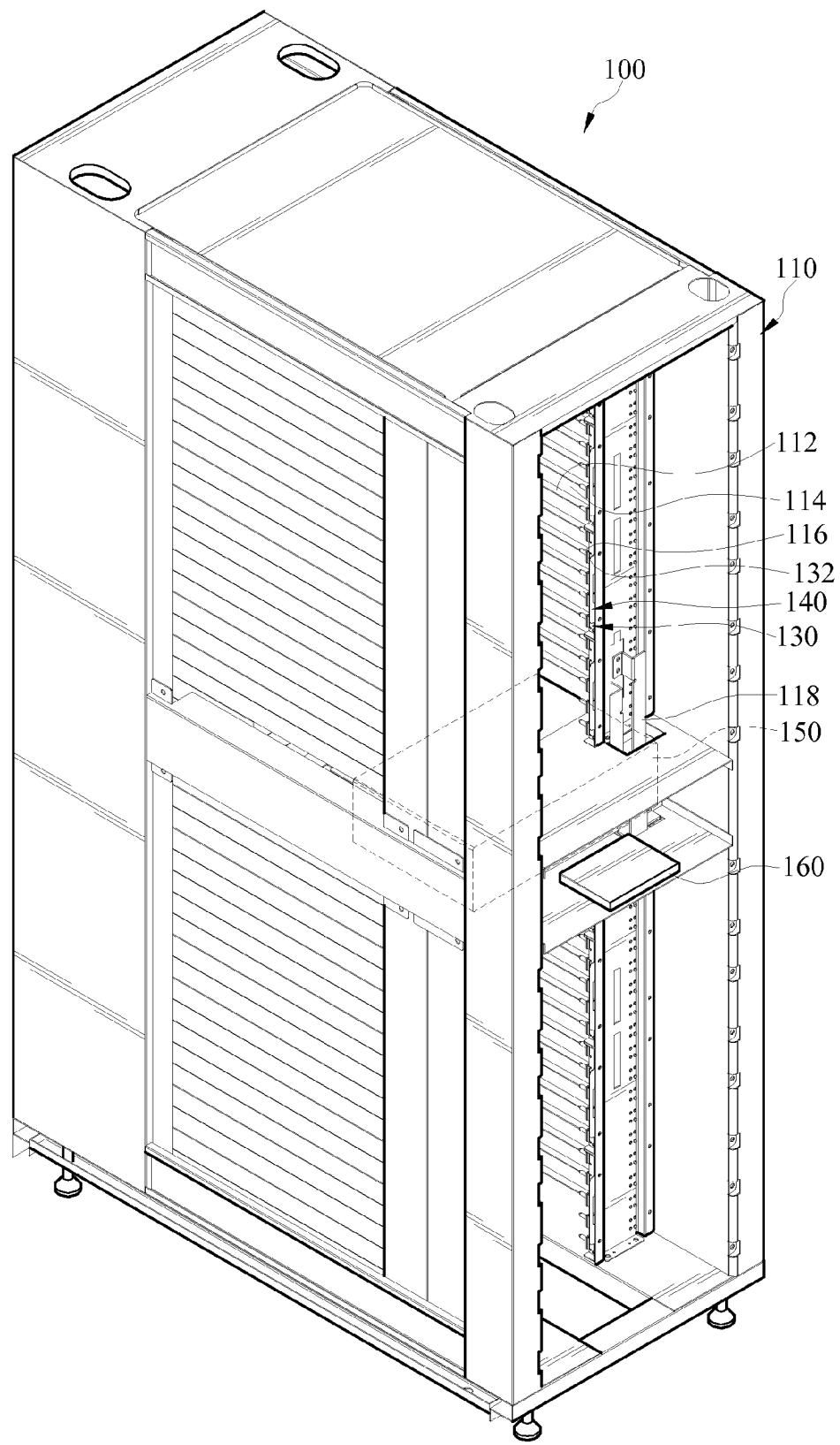
FIG. 4B illustrates a partially perspective view with another viewing angle of a server cabinet in FIG. 2.
Figure 5A:
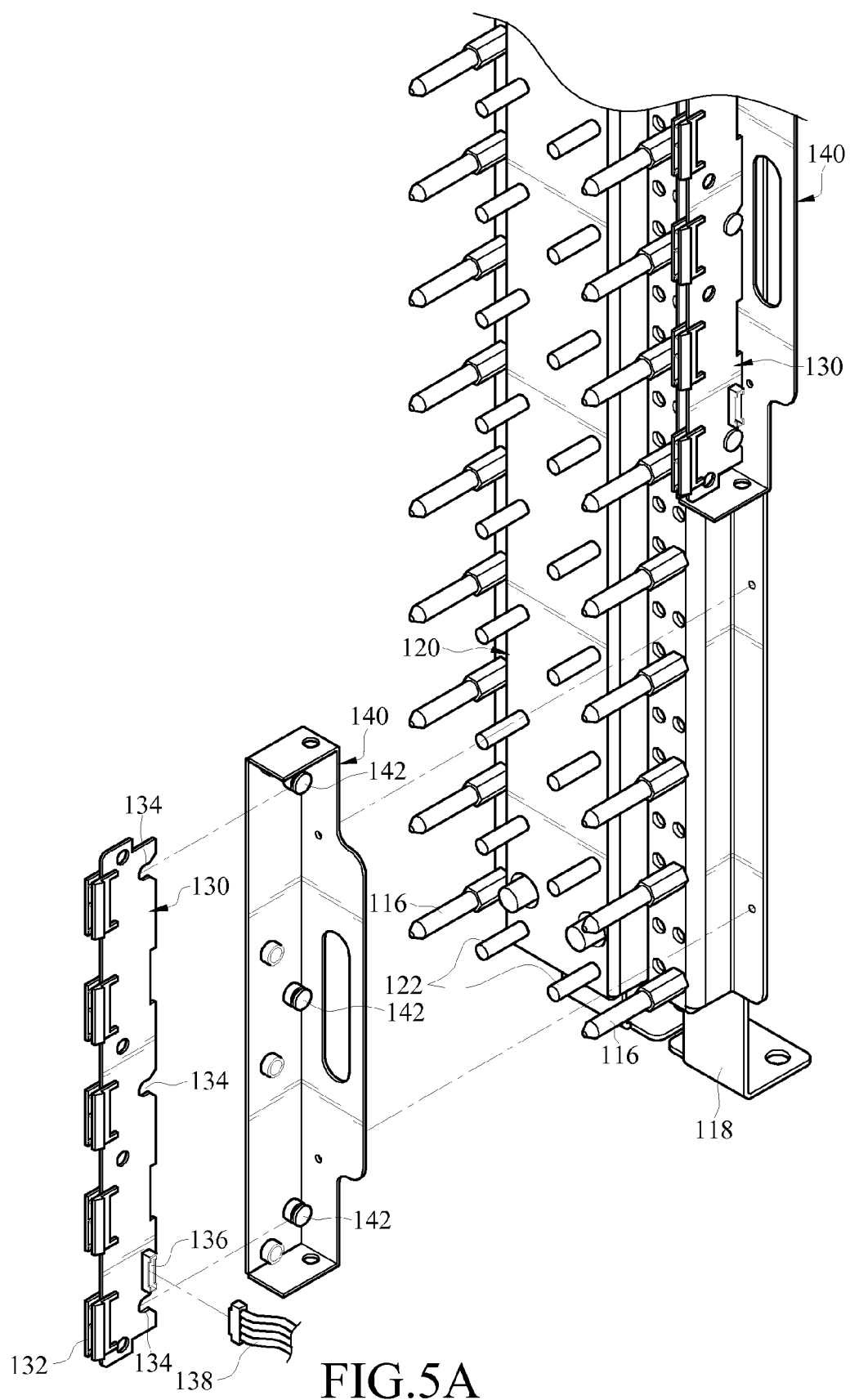
FIG. 5A illustrates a partial perspective view of a server cabinet in FIG. 4B.
Figure 5B:
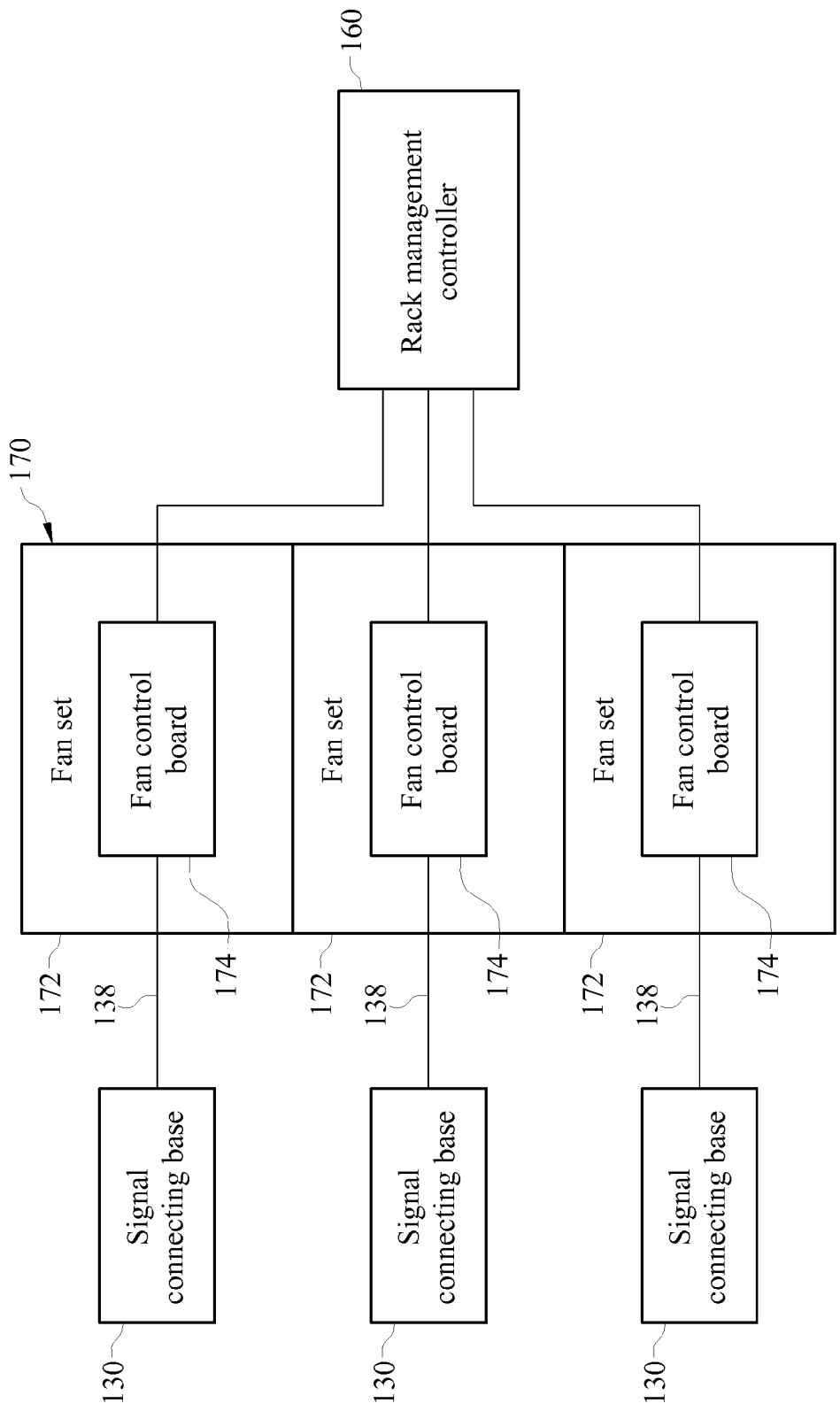
FIG. 5B illustrates a block diagram of multiple components electrically connected to each other in a server cabinet.
Figure 6:
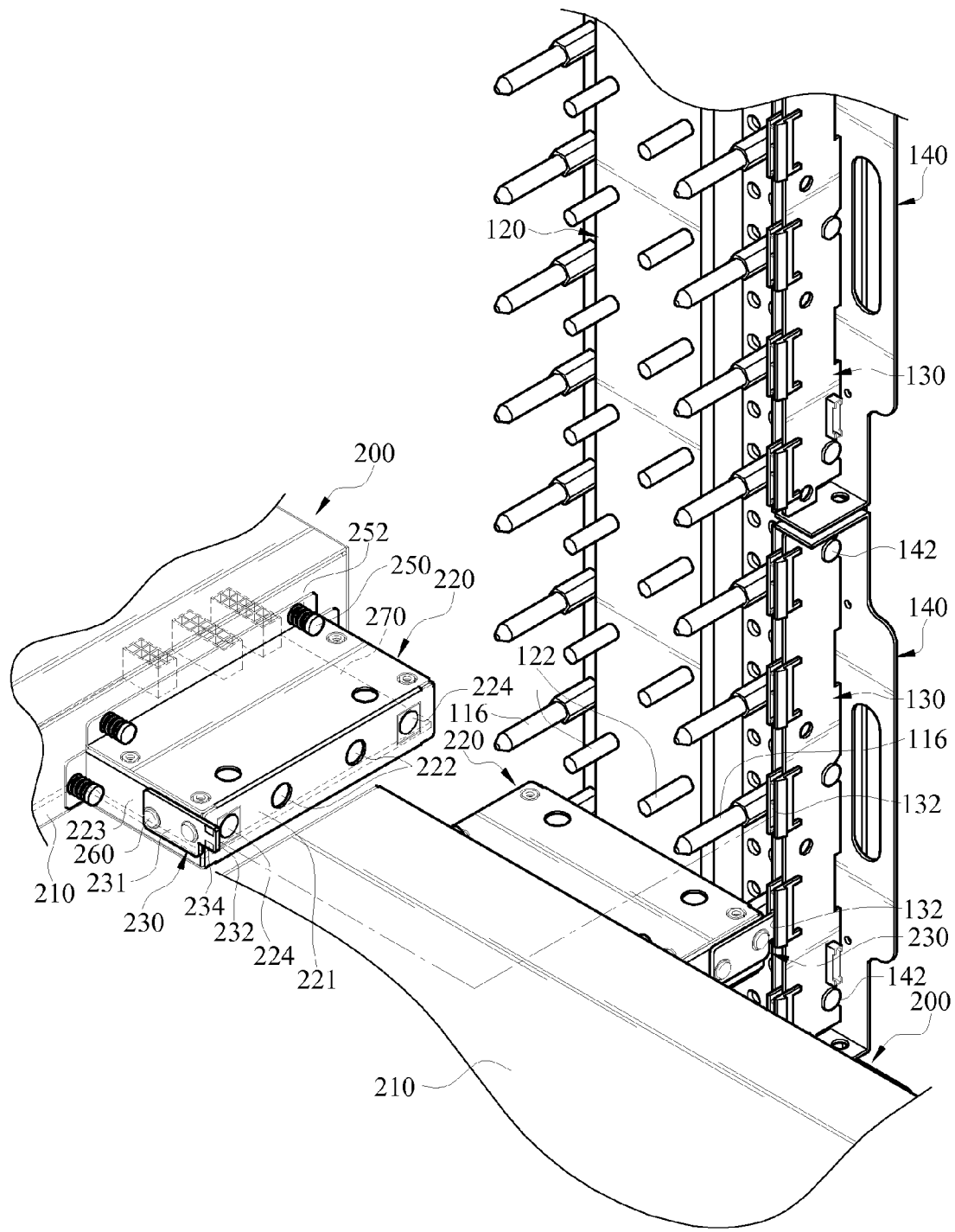
FIG. 6 illustrates a partially enlarged exploded view of the rack server system in FIG. 2.

Please refer to FIGS. 4A to 6 and 2. FIG. 4A illustrates a perspective view with another viewing angle of a server cabinet in FIG. 2, FIG. 4B illustrates a partially perspective view with another viewing angle of a server cabinet in FIG. 2, FIG. 5A illustrates a partial perspective view of a server cabinet in FIG. 4B, FIG. 5B illustrates a block diagram of multiple components electrically connected to each other in a server cabinet, and FIG. 6 illustrates a partially enlarged exploded view of the rack server system in FIG. 2.

A server cabinet 100 in this embodiment may contain the multiple above-mentioned servers 200 and comprise a container 110, an electrically conductive component 120, a power supply 150, a signal connecting base 130, a rack management controller 160 (RMC), and a fan wall 170.

The container 110 may be approximately divided into an upper space 1101, a middle space 1102, and a lower space 1103. The middle space 1102 of the container 110 is used for containing the power supply 150 and the RMC 160. The upper space 1101 and the lower space 1103 of the container 110 both include multiple loading grooves 114, respectively. Each of the loading grooves 114 has a group of loading rails 112 which are used for supporting the shell 210 of the server 200 such that the server 200 may be assembled in the loading grooves 114. Moreover, a supporting bracket 118 may be disposed on a side of the container 110 and extend from a lower side of the container 110 toward an upper side of the container 110.

The electrically conductive component 120 is disposed on the supporting bracket 118 for being fixed in the container 110. The electrically conductive component 120 extends from the lower side of the container 110 toward the upper side of the container 110, and the electrically conductive component 120 further comprises at least two electrically conductive pins 122 protruding from a surface of the electrically conductive component 120. In this embodiment, the electrically conductive component 120 includes multiple groups of the electrically conductive pins 122 and each group has the two electrically conductive pins 122 arranged abreast. Each group of the electrically conductive pins 122 (including the two electrically conductive pins 122) corresponds to one of the loading grooves 114. Each group of the electrically conductive pins 122 (including the two electrically conductive pins 122) is employed for insertion into the two power sockets 222 of the power input port 220 in each of the servers 200 such that the power input port 220 is electrically connected to the electrically conductive component 120.

Moreover, in some embodiments, the container 110 comprises at least one guiding pin 116 disposed on the supporting bracket 118 of the container 110. In this embodiment, two guiding pins 116 forming a group are arranged side by side, and each group of the guiding pins 116 (including two guiding pins 116) corresponds to one of the loading grooves 114. Moreover, the guiding pins 116 are in the vicinity of the electrically conductive pins 122. In detail, the two electrically conductive pins 122 in the same group are positioned between the two guiding pins 116 in the same group. The guiding pins 116 are employed for insertion into the corresponding positioning holes 224 of the power input ports 220 of the server 200, respectively, so as to provide guiding as well as positioning during assembling the server 200 in the loading groove 114 of the server cabinet 100.

However, in this embodiment, the number of each group of the guiding pins 116 (the number is two) is exemplary, but is not limited by this disclosure. In other embodiments, only if the number of the guiding pins 116 matches with that of the positioning holes 224 of the power input port 220 of the server 200, the benefit of the disclosure may be achieved as well.

Figure 7:
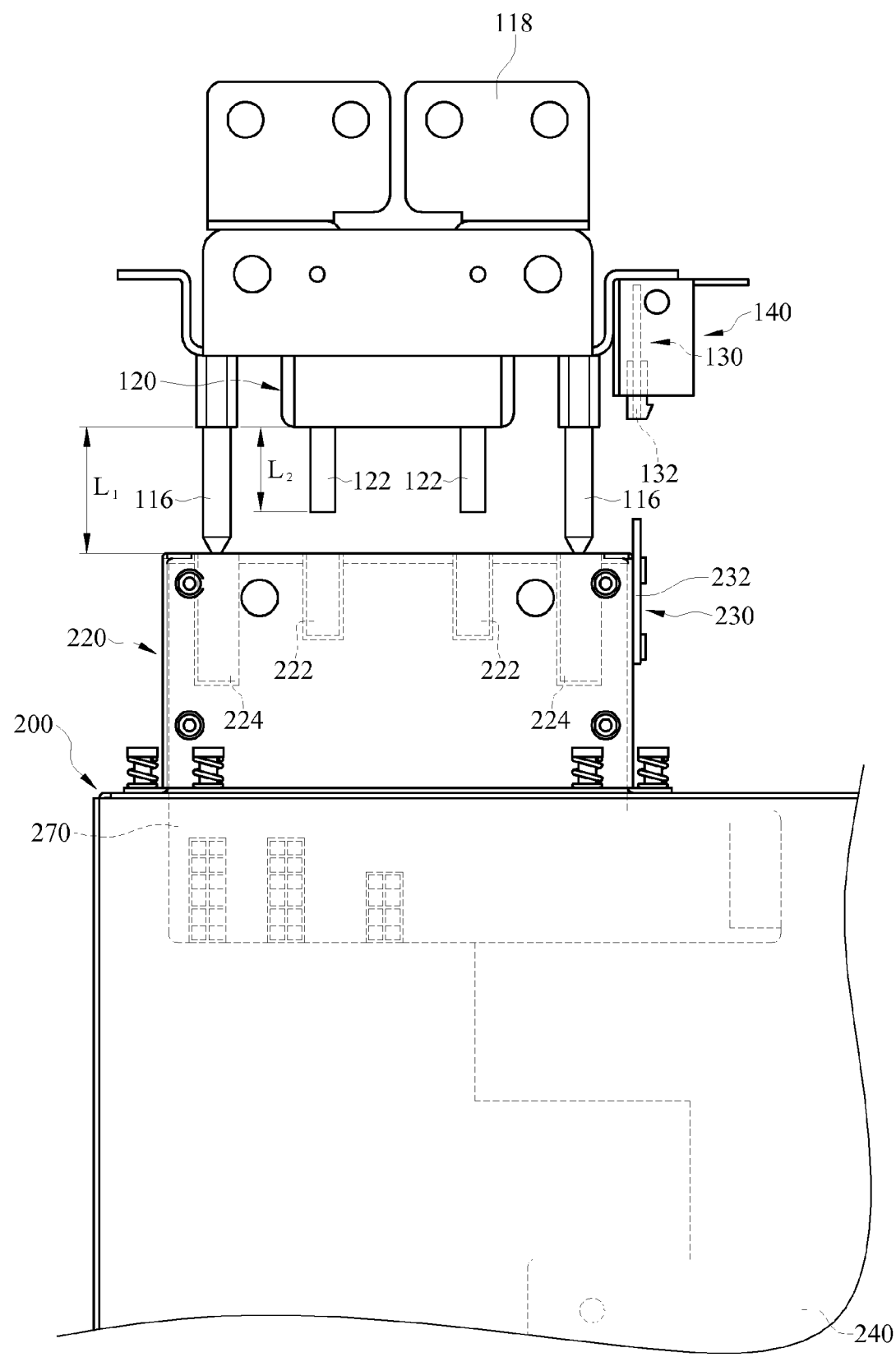
FIGS. 7 to 9 illustrate partial front views of the server and the server cabinet in FIG. 2.

Moreover, in some embodiments, a length L1 represents the length that the guiding pin 116 protrudes from the surface of the electrically conductive component 120, and a length L2 represents another length that the electrically conductive pin 122 protrudes from the surface of the electrically conductive component 120, shown in FIG. 7, which is a partial front view of the server and the server cabinet in FIG. 2. Therefore, during the process of assembling the server 200 into the server cabinet 100, the guiding pins 116 are inserted into the positioning holes 224 before the electrically conductive pins 122 are inserted into the power sockets 222. In this way, accurate positioning between the electrically conductive pins 122 and the power sockets 222 is achieved for preventing the server 200 from dislocation when assembling. If dislocation happens, the electrically conductive pin 122 may collide with the surface 221 of the power input port 220, which causes the electrically conductive pin 122 to be fractured.

Moreover, in this embodiment, the power supply 150 is disposed in the middle space 1102 of the container 110. The power supply 150 is electrically connected to the electrically conductive component 120, and is used for converting an external alternating current power into a direct current power. The power supply 150 supplies the direct current power to each of the servers 200 via the electrically conductive component 120. Therefore, additional built-in power supply modules do not need to be provided for each of the servers 200 and the direct current power needed by each of the servers 200 is supplied by the power supply 150 disposed in the middle space 1102 of container 110, such that the inner space of each of the servers 200 can be used flexibly and the cost of each of the servers 200 can be lowered.

In this embodiment, multiple signal connecting bases 130, provided, are disposed on the supporting bracket 118 of the container 110 and in the vicinity of the electrically conductive component 120. Each of the signal connecting bases 130 includes multiple connectors 132 which correspond to the loading grooves 114, respectively. The connectors 132 are used for being connected to multiple corresponding connecting elements 230 of the servers 200, respectively.

The RMC 160 is disposed in the middle space 1102 of the container 110. The fan wall 170 is positioned on a side of the container 110 for providing heat dissipation for each element in the container 110. The fan wall 170 comprises multiple fan sets 172. Each of the fan sets 172 comprises a fan controller board 174. Moreover, each of the signal connecting base 130 further comprises a signal port 136 which is electrically connected to the multiple connectors 132 at the same signal connecting base 130. Each of the signal ports 136 may be electrically connected to a port (not shown) of the fan controller board 174 via a cable 138. Furthermore, each of the fan controller boards 174 may be electrically connected to a port (not shown) of the RMC 160 via other cable (not shown) such that an electrical connection relationship between the RMC 160 and the signal connecting base 130 is achieved. The RMC 160 communicates with the mother board 240 of the server 200 via the fan controller board 174, the connector 132 of the signal connecting base 130 and the connecting element 230 of the server 200. The position of the connector 132 is about that the connector 132 is in which row of the container 11. The position of each connector 132 is determined in the container 110. Each connector 132 is corresponding to an area for the one sever 200 to position. The RMC 160 may determine the position of the server 200 in the container 110 according to the position of the connector 132 through which communication data sent back by the mother board 240 of the server 200 is transmitted. Since the multiple connectors 132 of the signal connecting base 130 may all share the single signal port 136, the number of the ports of the fan controller boards 174 and the RMC 160 may be reduced. The position of the server 200 is about that the server 200 is in which row of the container 110.

However, in this embodiment, the RMC 160 is electrically connected to the signal connecting base 130 via the fan controller board 174, but this feature is not limited to the disclosure. For example, in other embodiment, the RMC 160 may be directly connected to the signal connecting base 130 without passing through the fan controller board 174. That is to say, the RMC 160 may communicate with the mother board 240 of the server 200 directly via the connector 132 of the signal connecting base 130 and the connecting element 230 of the server 200. Also, the RMC 160 may determine the position of the certain server 200 in the container 110 according to the position of the connector 132 through which communication data sent back by the mother board 240 of the server 200 are transmitted.

Moreover, in some embodiments, the server cabinet 100 may further comprise a retaining element 140 which is fixed on the supporting bracket 118 of the container 110, and the signal connecting base 130 is disposed on the retaining element 140. Furthermore, the retaining element 140 may include at least one positioning element 142, and the signal connecting base 130 may include at least one positioning pit 134. The positioning element 142 is disposed in the positioning pit 134 such that a positioning effect when the signal connecting base 130 is disposed on the retaining element 140 is achieved. However, in this embodiment, the number of the positioning element 142 and the positioning pit 134 is three, respectively, but the number is not limited to the disclosure. The person skilled in the art may adjust the number of the positioning elements 142 and the positioning pits 134 according to actual requirement.

In addition, in some embodiments, the first fixing element 250 may further comprise an elastic structure 252, referring to FIG. 6, the elastic structure 252 may be a spring. The elastic structure 252 makes the power input port 220 slightly movable relative to the shell 210 such that the position of the connecting element 230 can be adjusted to correspond to that of the connector 132.

Figure 8:
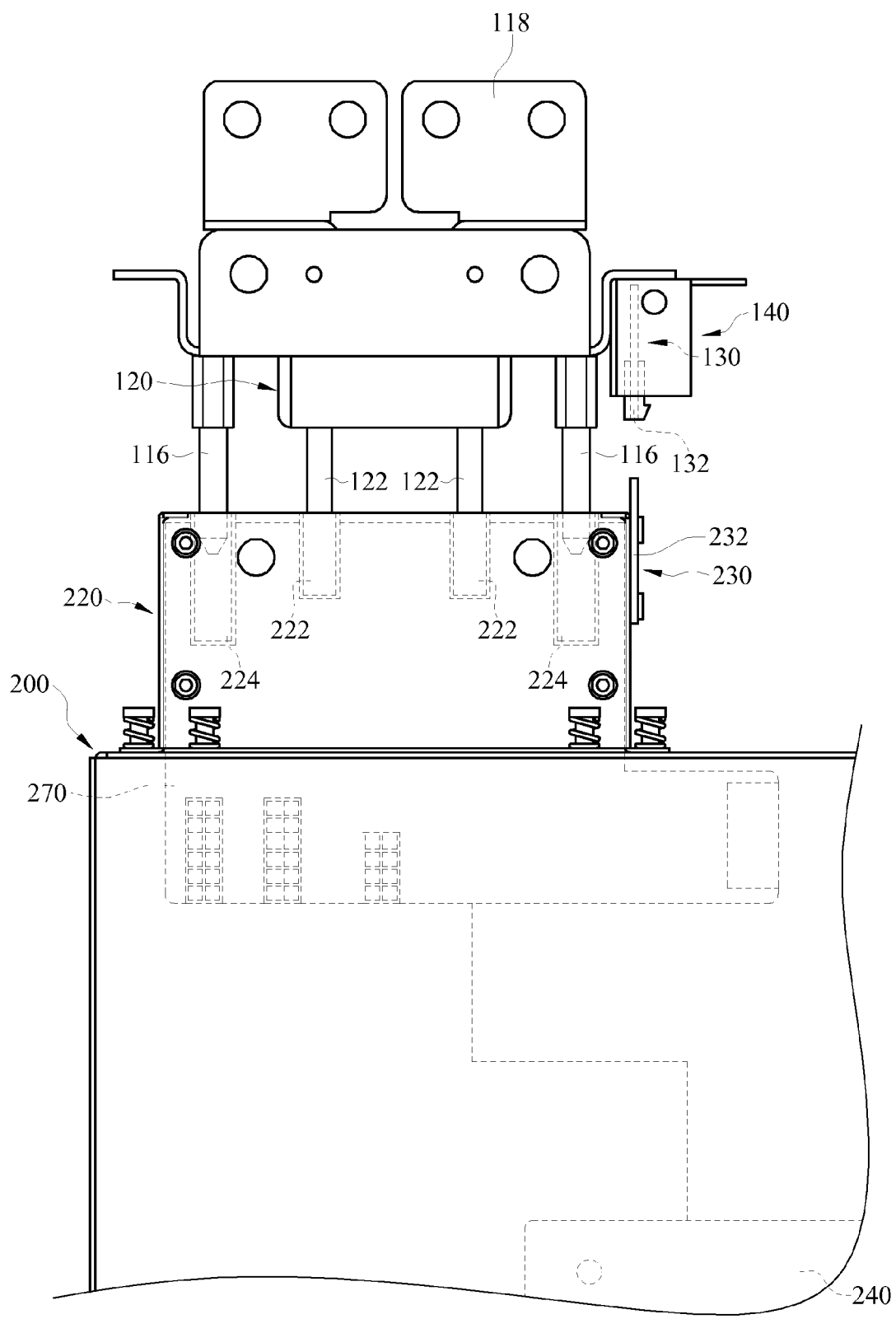
Figure 9:
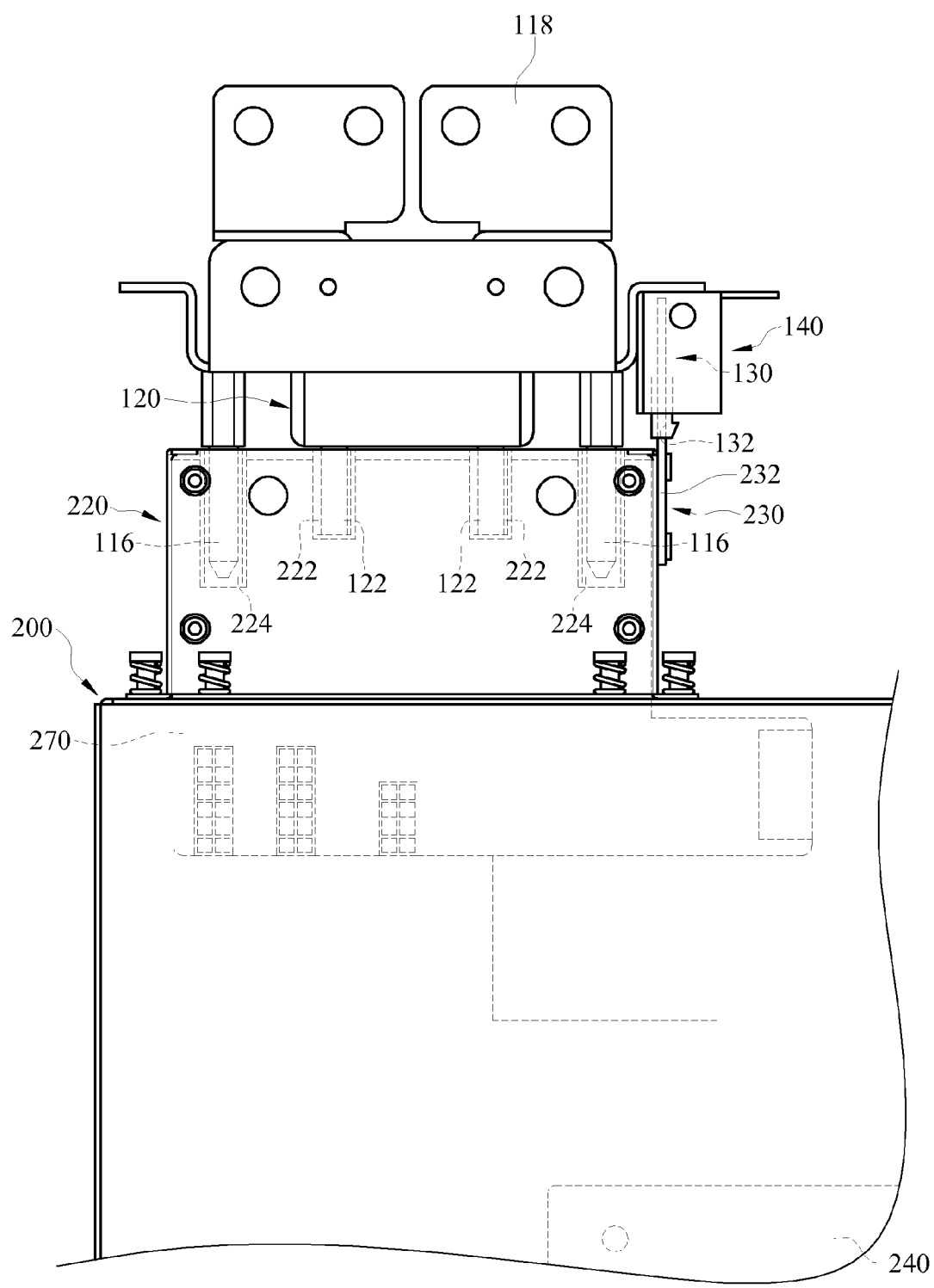

Please refer to FIGS. 6 to 9 and 2. FIGS. 8 and 9 illustrate a partial front view of the server and the server cabinet in FIG. 2.

When installing the server 200 into the corresponding loading grooves 114 of the server cabinet 100, the server 200 is positioned on the loading rail 112 and is moved toward the supporting bracket 118 in a horizontal direction. Accordingly, the length L1 that the guiding pin 116 protrudes from the surface of the electrically conductive component 120 is greater than the length L2 that the electrically conductive pin 122 protrudes from the surface of the electrically conductive component 120 (shown in FIG. 7), that the guiding pin 116 is inserted into the positioning hole 224 earlier (shown in FIG. 8). By the positioning effect between the guiding pin 116 and the positioning hole 224, the electrically conductive pin 122 is enabled to align with the power socket 222 such that the electrically conductive pin 122 may be inserted into the power socket 222 smoothly without interference. Moreover, while the electrically conductive pins 122 are inserted into the power socket 222 to be electrically connected to the power input port 220, the connecting element 230 is simultaneously inserted into the connector 132 of the signal connecting base 130 to be electrically connected to the signal connecting base 130.

Consequently, the RMC 160 may determine that the power input port 220 and the electrically conductive component 120 are in an electrical connection state depending on the electrical connection state between the connecting element 230 of the server 200 and the connector 132, so as to make the power supply 150 supply the power to the server 200. Accordingly, the RMC 160 communicates with the mother board 240 of the server 200 via the connector 132 of the signal connecting base 130 and the connecting element 230 of the server 200 directly. The RMC 160 determines that the position of the certain server 200 is in which row of the upper space 1101 or the lower space 1103 in the container 110 according to the position of the connector 132 through which the communication data sent back by the mother board 240 of the server 200 is transmitted. Therefore, each of the servers 200 is easily managed.

With the server 200 removed from the container 110, the power input port 220 and the connecting element 230 are separated from the electrically conductive component 120 and the connector 132, respectively. At this time, the RMC 160 may determine that the power input port 220 and the electrically conductive component 120 are separated from each other to be in an electrical disconnection state according to the electrical disconnection state between the connecting element 230 of the server 200 and the connector 132. Therefore, the power supply 150 may stop supplying the power to the server 200. With the server 200 installed into the container 110, the power input port 220 and the connecting element 230 joint with the electrically conductive component 120 and the connector 132, respectively.

In the rack server system according to the above-mentioned embodiment, when the server is inserted in the container, the power input port and the connecting element are electrically connected to the electrically conductive component and the corresponding connector, respectively. With the server removed from the container, the power input port and the connecting element are separated from the electrically conductive component and the corresponding connector respectively to be electrically disconnected from each other. The process of inserting the server into the container makes the power input port connect to the electrically conductive component as well as the connecting element connecting to the corresponding connector. Therefore, connecting the power input port to the electrically conductive component additionally and connecting the connecting element to the corresponding connector additionally are not needed. Moreover, the RMC is provided such that each of the servers in the whole rack server system is easy to be managed.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A rack server system, comprising:
   a container;
   an electrically conductive component fixed in the container;
   a power supply disposed in the container, wherein the power supply is electrically connected to the electrically conductive component for supplying a direct current power;
   a signal connecting base fixed in the container, the signal connecting base including multiple connectors;
   a server disposed in the container in a removable way, wherein the server comprises a power input port and a connecting element, and wherein the power input port is electrically connected to the electrically conductive component in the removable way, and wherein the connecting element is connected to one of the connectors in the removable way, and wherein with the server removed from the container, the power input port and the connecting element are separated from the electrically conductive component and the one of the connectors, respectively, and with the server installed into the container, the power input port and the connecting element joint with the electrically conductive component and the one of the connectors, respectively; and
   a rack management controller (RMC) disposed in the container, wherein the RMC is electrically connected to the signal connecting base, and wherein when the connecting element of the server is electrically connected to the one of the connectors, the RMC communicates with the server via the one of the connectors and the connecting element of the server, and determines the position of the server in the container according to the position of the one of the connectors which is electrically connected to the server.

2. The rack server system according to claim 1, wherein the power input port of the server further includes two power sockets, and wherein the electrically conductive component further comprises two electrically conductive pins protruding from a surface of the electrically conductive component, and wherein the electrically conductive pins are used for insertion into the two power sockets, respectively, such that the power input port is electrically connected to the electrically conductive component.

3. The rack server system according to claim 1, wherein the power input port of the server further includes at least one positioning hole, and wherein the container further includes at least one guiding pin in the vicinity of the electrically conductive component, and wherein the guiding pin is used for insertion into the positioning hole.

4. The rack server system according to claim 3, wherein the power input port of the server further includes two power sockets, and wherein the electrically conductive component further comprises two electrically conductive pins protruding from a surface of the electrically conductive component, and wherein the two electrically conductive pins are used for insertion into the two power sockets such that the power input port is electrically connected to the electrically conductive component.

5. The rack server system according to claim 4, wherein a length that the guiding pin protrudes from the surface of the electrically conductive component is greater than another length that the electrically conductive pin protrudes from the surface of the electrically conductive component.

6. The rack server system according to claim 1, wherein the connecting element of the server is in the vicinity of the power input port.

7. The rack server system according to claim 6, wherein the connecting element of the server comprises a protruding part, and wherein the protruding part includes an electrically conductive layer, and wherein the connecting element is disposed on a side of the power input port, and wherein the protruding part protrudes from the power input port, and wherein the protruding part is used for insertion into the one of the connectors such that the connecting element is electrically connected to the one of the connectors via the electrically conductive layer.

8. The rack server system according to claim 1, further comprising a retaining element fixed in the container, wherein the signal connecting base is fixed to the retaining element.

9. The rack server system according to claim 8, wherein the retaining element includes a positioning element, the signal connecting base includes a positioning pit, and the positioning element is disposed in the positioning pit.

10. The rack server system according to claim 8, wherein the server comprises a shell and a mother board which are disposed in the shell, the power input port is disposed on a side of the shell, and the power input port and the connecting element are both electrically connected to the mother board.

11. The rack server system according to claim 10, wherein the RMC communicates with the mother board of the server via the one of the connectors and the connecting element, and determines the position of the server in the container according to the position of the one of the connectors which is electrically connected to the server.

12. The rack server system according to claim 1, further comprising a fan wall disposed in the container, wherein the fan wall comprises multiple fan sets, and wherein each of the fan sets comprises a fan controller board, and wherein the fan controller board is electrically connected between the signal connecting base and the RMC, and the RMC communicates with the server via the fan controller board, the one of the connectors and the connecting element, and determines the position of the server in the container according to the position of the one of the connectors which is electrically connected to the server.

\* \* \* \* \*